(12) United States Patent
Saeki et al.

(10) Patent No.: US 7,863,690 B2
(45) Date of Patent: Jan. 4, 2011

(54) SEMICONDUCTOR DEVICE

(75) Inventors: Katsutoshi Saeki, Miyagi (JP); Yoshitaka Satou, Miyagi (JP)

(73) Assignee: Oki Semiconductor, Ltd., Tokyo (JP)

( * ) Notice: Subject to any disclaimer, the term of this patent is extended or adjusted under 35 U.S.C. 154(b) by 0 days.

(21) Appl. No.: 12/713,524

(22) Filed: Feb. 26, 2010

(65) Prior Publication Data
US 2010/0148279 A1   Jun. 17, 2010

Related U.S. Application Data

(62) Division of application No. 12/076,054, filed on Mar. 13, 2008, now Pat. No. 7,696,084.

(30) Foreign Application Priority Data

Mar. 27, 2007   (JP) .............................. 2007-081759

(51) Int. Cl.
*H01L 21/00* (2006.01)
(52) U.S. Cl. .................. 257/392; 257/324; 257/314
(58) Field of Classification Search .................. 257/392, 257/324, 314
See application file for complete search history.

(56) References Cited

U.S. PATENT DOCUMENTS

| | | | |
|---|---|---|---|
| 6,417,565 B1 * | 7/2002 | Komatsu | 257/750 |
| 7,211,878 B2 * | 5/2007 | Ono | 257/645 |
| 7,262,992 B2 * | 8/2007 | Shibata et al. | 365/185.05 |
| 7,608,887 B2 * | 10/2009 | Orita et al. | 257/326 |
| 7,696,084 B2 * | 4/2010 | Saeki et al. | 438/622 |
| 2003/0011035 A1 * | 1/2003 | Komatsu | 257/407 |
| 2004/0228499 A1 * | 11/2004 | Shibata et al. | 381/312 |
| 2007/0126047 A1 * | 6/2007 | Orita et al. | 257/314 |
| 2008/0237730 A1 * | 10/2008 | Saeki et al. | 257/369 |
| 2008/0237878 A1 * | 10/2008 | Satou | 257/773 |
| 2009/0045454 A1 * | 2/2009 | Takaya et al. | 257/324 |
| 2009/0090959 A1 * | 4/2009 | Nishihara et al. | 257/324 |
| 2009/0090960 A1 * | 4/2009 | Izumi et al. | 257/324 |
| 2009/0325351 A1 * | 12/2009 | Orita et al. | 438/261 |
| 2010/0148279 A1 * | 6/2010 | Saeki et al. | 257/392 |

FOREIGN PATENT DOCUMENTS

| | | |
|---|---|---|
| JP | 2005-064295 | 3/2005 |
| JP | 2007-157874 | 6/2007 |
| JP | 2008-244097 | 10/2008 |
| JP | 2008244097 A * | 10/2008 |

* cited by examiner

*Primary Examiner*—Laura M Menz
(74) *Attorney, Agent, or Firm*—Kubotera & Associates LLC

(57) ABSTRACT

A semiconductor device includes a first field effect transistor and a second field effect transistor. The first field effect transistor includes a first gate electrode formed; first impurity diffused areas; and first sidewall portions. The first sidewall portions include a first lower insulation film and a first charge accumulation film. The second field effect transistor includes a second gate electrode; second impurity diffused areas; and second sidewall portions. The second sidewall portions include a second lower insulation film and a second charge accumulation film. The first lower insulation film contains one of a silicon thermal oxide film and a non-doped silicate glass, and the second lower insulation film contains a non-doped silicate glass. The second sidewall portions have a width along a gate longitudinal direction larger than that of the first sidewall portions. The second lower insulation film has a thickness larger than that of the first lower insulation film.

6 Claims, 6 Drawing Sheets

SEMICONDUCTOR DEVICE

CROSS-REFERENCE TO RELATED APPLICATIONS

This is a divisional application of a prior application Ser. No. 12/076,054, filed Mar. 13, 2008, now U.S. Pat. No. 7,696,084.

BACKGROUND OF THE INVENTION AND RELATED ART STATEMENT

The present invention relates to a semiconductor device. In particular, the present invention relates to a semiconductor non-volatile memory.

As a semiconductor non-volatile memory, it has been proposed to adopt a sidewall type (sidewall type memory), in which electron charge accumulation portions with a sidewall shape are disposed on both sides of a gate electrode of one single transistor (refer to Patent Reference).

Patent Reference Japanese Patent Publication No. 2005-64295

With reference to FIG. 6, a conventional semiconductor non-volatile memory will be explained. FIG. 6 is a schematic sectional view showing a conventional semiconductor non-volatile memory 110 of the sidewall type.

In the conventional semiconductor non-volatile memory 110 described in Patent Reference, a memory cell portion 123 for storing information and a peripheral circuit portion 126 for writing and retrieving information to and from the memory cell portion 123 are disposed on a common semiconductor substrate. In general, the memory cell portion 123 and the peripheral circuit portion 126 are provided with a plurality of transistors. In FIG. 6, the memory cell portion 123 and the peripheral circuit portion 126 are provided with one transistor as an example.

The memory cell portion 123 is provided with a first MOS type transistor (first MOSFET or Metal Oxide Semiconductor Field Effect Transistor) 130 disposed on a p-type silicon substrate 120. The first MOSFET 130 is provided with a gate electrode 134, a pair of impurity diffused areas 140a and 140b, and variable resistor portions 142.

The gate electrode 134 is disposed on the silicon substrate 120 through a gate insulation film 132. The impurity diffused areas 140a and 140b are formed through diffusing an n-type impurity in areas of the silicon substrate 120 sandwiching the gate electrode 134. The impurity diffused areas 140a and 140b function as a source and a drain of the first MOSFET 130, respectively.

In the conventional semiconductor non-volatile memory 110 shown in FIG. 6, the impurity diffused area 140a functions and is referred to as a source 140a, and the impurity diffused area 140b functions and is referred to as a drain 140b.

The variable resistor portions 142 are formed in the silicon substrate 120 between a portion below the gate electrode 134 and the impurity diffused areas 140a and 140b. The variable resistor portions 142 are formed through diffusing the n-type impurity same as that of the impurity diffused areas 140a and 140b at a concentration lower than that of the impurity diffused areas 140a and 140b.

In the first MOSFET 130 of the memory cell portion 123, charge accumulation portions 150a and 150b are disposed on the variable resistor portions 142. The charge accumulation portions 150a and 150b are formed of a laminated structure of a bottom oxide film 152, a charge accumulation film 154, and a top oxide film 156 sequentially laminated in this order. The charge accumulation portions 150a and 150b are capable of accumulating charges.

In the conventional semiconductor non-volatile memory 110 of the sidewall type, resistivity of the variable resistor portions 142 formed in the silicon substrate 120 below the charge accumulation portions 150a and 150b changes according to whether the charge accumulation portion 150a on a side of the drain 140a and the charge accumulation portion 150b on a side of the source 140b accumulate electrons. A state that the charge accumulation portions 150a and 150b accumulate electrons is designated as 1, and a state that the charge accumulation portions 150a and 150b do not accumulate electrons is designated as 0, so that data can be distinguished.

In order to charge electrons into the charge accumulation portion 150a on the side of the drain 140a, the source 140b and the silicon substrate 120 are grounded, and a positive potential is applied to the gate electrode 134 and the drain 140a. At this time, electrons flowing through a channel become a high energy state, i.e., hot electrons, near the drain 140a due to a strong electric field toward the drain 140a. The hot electrons are charged into the charge accumulation portion 150a on the side of the drain 140a due to an electric field toward the gate electrode 134.

In order to retrieve information from the charge accumulation portion 150a on the side of the drain 140a, the drain 140a and the silicon substrate 120 are grounded, and a positive potential is applied to the gate electrode 134 and the source 140b.

When electrons are accumulated in the charge accumulation portion 150a on the side of the drain 140a, the electrons accumulated in the charge accumulation portion 150a induce positive charges in the variable resistor portion 142 situated below the charge accumulation portion 150a. Accordingly, due to the induced positive charges, the resistivity of the variable resistor portion 142 situated below the charge accumulation portion 150a increases, thereby decreasing a current between the source and the drain (channel current).

On the other hand, when the electrons are not accumulated in the charge accumulation portion 150a on the side of the drain 140a, the resistivity of the variable resistor portion 142 situated below the charge accumulation portion 150a does not change, thereby causing no change in the channel current. Accordingly, through a level of the channel current, it is possible to distinguish whether the charges are accumulated, or the data is 0 and 1.

When one MOSFET having a charge accumulation portion is regarded as a memory unit, i.e., a memory cell, in the memory of the sidewall type, it is possible to store information of two bits in one memory cell through changing a voltage applied to a source and a drain thereof. In the peripheral circuit portion 126, the transistor has a configuration similar to that of the memory cell portion 123 for writing and retrieving information to and from the memory cell portion 123.

The peripheral circuit portion 126 is provided with a second MOSFET 160 disposed on the p-type silicon substrate 120. The second MOSFET 160 is provided with a gate electrode 164, a pair of impurity diffused areas 170, and variable resistor portions 172. The gate electrode 164 is disposed on the silicon substrate 120 through a gate insulation film 162.

In the second MOSFET 160 of the peripheral circuit portion 126, charge accumulation portions 180 are disposed on the variable resistor portions 172. The charge accumulation portions 180 are formed of a laminated structure of a bottom oxide film 182, a charge accumulation film 184, and a top oxide film 186 sequentially laminated in this order. The charge accumulation portions 180 are capable of accumulating charges.

It is possible to concurrently produce the first MOSFET 130 of the memory cell portion 123 and the second MOSFET 160 of the peripheral circuit portion 126. In this case, the first MOSFET 130 and the second MOSFET 160 have an identical configuration.

As described above, in the conventional semiconductor non-volatile memory, similar to the memory cell portion, the peripheral circuit portion has the laminated structure capable of accumulating charges. Accordingly, when the transistor of the peripheral circuit portion is turned on, electrons flowing through the channel become a high-energy state, i.e., hot electrons, near the drain due to a strong electric field toward the drain. The hot electrons are charged into the charge accumulation portion.

When electrons flow through the channel, the electrons may become impact ions due to the strong electric field near the drain. As a result, the impact ions impede with surrounding atoms, thereby generating electron positive hole pairs. When the electrons and the positive holes are accumulated in the charge accumulation portion, a phenomenon called drain avalanche charging may occur.

In the peripheral circuit portion, the charges charged into the charge accumulation portion remain as is. Accordingly, when the field effect transistor is in a turned on state, an amount of the current between the drain and the source may decrease. As a result, in the field effect transistor with the peripheral circuit portion, as compared with normal deterioration due to charging and trapping electrons or positive holes in the gate insulation film, the charges thus remaining have a large influence on the change in the amount of the current, thereby lowering reliability of the element.

In view of the problems described above, an object of the present invention is to provide a semiconductor device to solve the problems of the conventional semiconductor device, and a method of producing the semiconductor device. In particular, in the semiconductor of the invention, it is arranged to reduce an amount of charges, i.e., hot carriers, charged into a charge accumulation film in a peripheral circuit portion. Accordingly, it is possible to effectively prevent the peripheral circuit portion from deteriorating due to the hot carriers.

Further objects and advantages of the invention will be apparent from the following description of the invention.

SUMMARY OF THE INVENTION

In order to attain the objects described above, according a first aspect of to the present invention, a semiconductor device includes a semiconductor substrate having a first area and a second area; a first field effect transistor disposed in the first area; and a second field effect transistor disposed in the second area.

In the semiconductor device, the first field effect transistor includes a first gate electrode formed on the semiconductor substrate with a gate insulation film therebetween; a pair of first impurity diffused areas formed in areas sandwiching the first gate electrode of the semiconductor substrate; and a pair of first sidewall portions disposed adjacent to the first gate electrode. The first sidewall portions include a first lower insulation film and a first charge accumulation film laminated sequentially.

In the semiconductor device, the second field effect transistor includes a second gate electrode formed on the semiconductor substrate with a gate insulation film therebetween; a pair of second impurity diffused areas formed in areas sandwiching the second gate electrode of the semiconductor substrate; and a pair of second sidewall portions disposed adjacent to the second gate electrode. The second sidewall portions include a second lower insulation film and a second charge accumulation film laminated sequentially.

In the semiconductor device, the first lower insulation film contains at least one of a silicon thermal oxide film and a non-doped silicate glass, and the second lower insulation film contains a non-doped silicate glass. Further, the second sidewall portions have a width along a gate longitudinal direction larger than that of the first sidewall portions. The second lower insulation film has a thickness larger than that of the first lower insulation film.

According a second aspect of to the present invention, a method of producing a semiconductor device includes the steps of: preparing a semiconductor substrate; defining a first area and a second area on the semiconductor substrate; laminating sequentially an insulation film and a conductive film in the first area and the second area on one of main surfaces of the semiconductor substrate; and patterning the conductive film to form a first gate electrode in the first area and a second gate electrode in the second area.

Further, the method includes the steps of: depositing a non-doped silicate glass over the semiconductor substrate, the first gate electrode, and the second gate electrode; removing the non-doped silicate glass on the first gate electrode; and forming a silicon thermal oxide film covering the first gate electrode in the first area and the non-doped silicate glass in the second area on the semiconductor substrate through thermal oxidation.

Further, the method includes the steps of: forming a laminated film for sidewalls including a film for charge accumulation on the silicon thermal oxide film; etching the laminated film for sidewalls, the silicon thermal oxide film in the first area, and the silicon thermal oxide film and the non-doped silicate glass in the second area in a direction perpendicular to the main surface of the semiconductor substrate to form a first sidewall portion on a sidewall of the first gate electrode and a second sidewall portion on a sidewall of the second gate electrode; and introducing impurity ions at a high concentration with the first gate electrode, the first sidewall portion, the second gate electrode, and the second sidewall portion as a mask.

In the method of producing a semiconductor device, after the step of depositing a first non-doped silicate glass on the semiconductor substrate for covering the first gate electrode and the second gate electrode, there may be the steps of: removing the non-doped silicate glass in the first area; depositing a second non-doped silicate glass on the semiconductor substrate in the first area for covering the first gate electrode; and depositing the second non-doped silicate glass on the first non-doped silicate glass in the second area.

Afterward, the method may further include the steps of: forming a laminated film for sidewalls including a film for charge accumulation on the second non-doped silicate glass; and etching anisotropically the laminated film for sidewalls, the first non-doped silicate glass, and the second non-doped silicate glass in a direction perpendicular to the main surface of the semiconductor substrate to form a first sidewall portion on a sidewall of the first gate electrode and a second sidewall portion on a sidewall of the second gate electrode.

In the first aspect of the present invention, the second sidewall portions have the width along the gate longitudinal direction larger than that of the first sidewall portions. Accordingly, in the second field effect transistor, it is possible to reduce an electric field near the impurity diffused area functioning as a drain. As a result, it is possible to reduce an amount of hot carriers such as hot electrons generated near the drain.

Further, in the first aspect of the present invention, the second lower insulation film has the thickness larger than that of the first lower insulation film. Accordingly, in the second field effect transistor, it is possible to increase a distance between a position where hot carriers are generated and the charge accumulation film. As a result, it is possible to reduce a charge efficiency of hot carriers into the charge accumulation film.

As described above, in the second field effect transistor, as opposed to the first field effect transistor, it is possible to reduce an amount of hot carriers and a charge efficiency of hot carriers. Accordingly, an amount of hot carriers charged into the charge accumulation film decreases. When the first area is used as a memory cell and the second area is used as a peripheral circuit portion, it is possible to reduce an amount of charges into the charge accumulation film of the transistor of the peripheral circuit portion, thereby preventing the peripheral circuit portion from deteriorating due to hot carriers.

In the second aspect of the present invention, the method of producing a semiconductor device includes the steps of depositing and thermally oxidizing the non-doped silicate glass after the non-doped silicate glass is deposited, so that the second lower insulation film has the thickness larger than that of the first lower insulation film. Accordingly, as opposed to a case in which a lower insulation film is formed only through thermal oxidation, it is possible to reduce an influence on an impurity distribution under the sidewall portion.

DETAILED DESCRIPTION OF THE PREFERRED EMBODIMENTS

Figure 1:
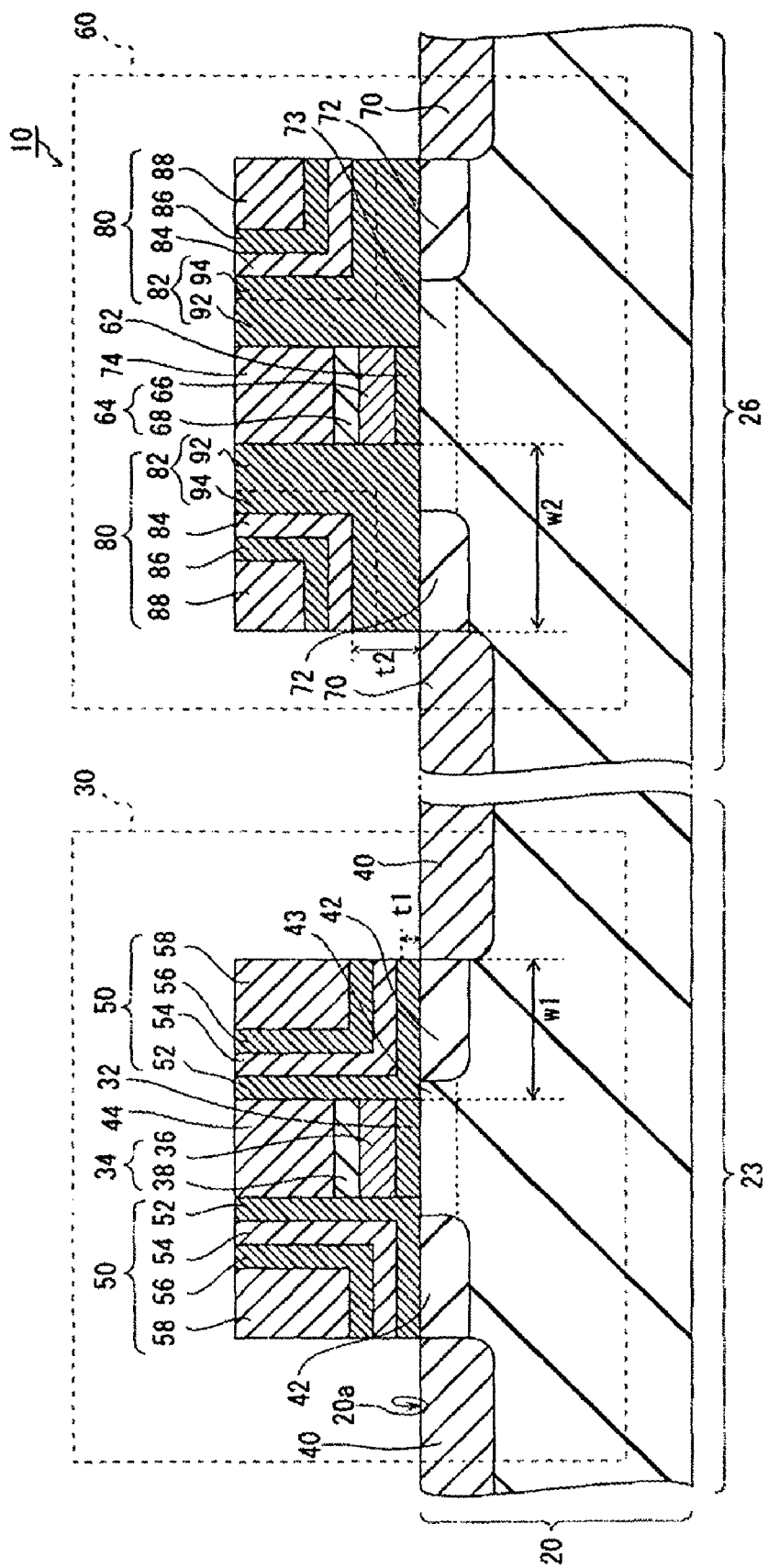
FIG. 1 is a schematic view showing a semiconductor non-volatile memory according to an embodiment of the present invention.

Hereunder, embodiments of the present invention will be explained with reference to the accompanying drawings. The drawings are just illustratively showing a shape, a size, and a dimensional arrangement of a component for explaining the embodiments, and the invention is not limited to those shown in the drawings.

With reference to FIG. 1, a semiconductor non-volatile memory 10 will be explained as a semiconductor device according to an embodiment of the present invention. FIG. 1 is a schematic sectional view showing the semiconductor non-volatile memory 10 according to the embodiment of the present invention.

As shown in FIG. 1, the semiconductor non-volatile memory 10 includes a semiconductor substrate 20 with a first conductive type having a first area 23 and a second area 26 defined thereon; a first MOS-type transistor (first MOSFET or Metal Oxide Semiconductor Field Effect Transistor) 30 disposed in the first area 23; and a second MOSFET 60 disposed in the second area 26.

In the embodiment, the semiconductor substrate 20 is formed of a p-type silicon substrate. The first MOSFET 30 and the second MOSFET 60 are MOSFETs with a second conductive type different from the first conductive type. That is, when the first conductive type is a p-type, the first MOSFET 30 and the second MOSFET 60 are n-type MOSFETs. Note that the semiconductor substrate 20 may be formed of a semiconductor substrate having a p-type well. In this case, similar to a well-known configuration, an NMOS is disposed in the well. In FIG. 1, an interlayer insulation film, a contact hole, a metal wiring portion disposed on the interlayer insulation film, and the likes are not shown, and explanations thereof are omitted.

In the embodiment, the first area 23 of the semiconductor non-volatile memory 10 functions as a memory cell portion for storing information, and the second area 26 functions as a peripheral circuit portion for writing and reading information relative to the memory cell portion.

In general, a plurality of MOSFETs is disposed in the memory cell portion and the peripheral circuit portion. In FIG. 1, for explanation purpose, one MOSFET is disposed in each of the memory cell portion and the peripheral circuit portion, respectively. In the following description, the first area 23 is referred to as the memory cell portion, and the second area 26 is referred to as the peripheral circuit portion.

In the embodiment, the first MOSFET 30 disposed in the first area 23 is provided with a first gate electrode 34, a pair of first impurity diffused areas 40, and a pair of first sidewall portions 50. The first gate electrode 34 is disposed on a main surface 20a of the semiconductor substrate 20 with a gate insulation film 32 therebetween. The first gate electrode 34 is formed of a laminated structure so-called a polycide structure, in which a poly-silicon film 36 and a tungsten silicide film 38 as a metal silicide film are sequentially laminated. A nitride film mask 44 is formed on the first gate electrode 34.

In the embodiment, the first impurity diffused areas 40 are formed in the semiconductor substrate 20 adjacent to the main surface 20a thereof. When the main surface 20a of the semiconductor substrate 20 is viewed from above in a plan view, the first impurity diffused areas 40 sandwich the first gate electrode 34 in a longitudinal direction thereof (gate longitudinal direction) and away from the first gate electrode 34. Further, the first impurity diffused areas 40 are areas where a second conductive type impurity, i.e., arsenic (As) as an n-type impurity, is diffused at a high concentration. The first impurity diffused areas 40 function as main electrode areas, i.e., a drain and a source, when the first MOSFET 30 is in operation.

In the embodiment, the first sidewall portions 50 are formed on the main surface 20a of the semiconductor substrate 20 adjacent to and directly contacting with the first gate electrode 34. More specifically, the first sidewall portions 50 are formed on the main surface 20a of the semiconductor substrate 20 contacting with side surfaces of the gate insulation film 32, the first gate electrode 34, and the nitride film mask 44, so that the first sidewall portions 50 have a height same as that of the nitride film mask 44.

When the main surface 20a of the semiconductor substrate 20 is viewed from above in a plan view, the first sidewall portions 50 are arranged adjacent to the first impurity diffused areas 40. Further, each of the first sidewall portions 50 is formed of a laminated structure capable of accumulating charges (ONO structure), in which a first lower insulation film 52, a first charge accumulation film 54, a first upper insulation film 56, and a first sidewall nitride film 58 are sequentially laminated.

In the embodiment, the first lower insulation films 52 are formed on the main surface 20a of the semiconductor substrate 20 in an L-shape contacting with side surfaces of the gate insulation film 32, the first gate electrode 34, and the nitride film mask 44. Similarly, the first charge accumulation films 54 are arranged on the first lower insulation films 52 in an L-shape. Similarly, the first upper insulation films 56 are arranged on the first charge accumulation films 54 in an L-shape. Further, the first sidewall nitride films 58 are filled in recess portions of the first upper insulation films 56 in an L-shape such that upper surfaces thereof are flush with a top surface of the nitride film mask 44.

As described above, the first sidewall portions 50 are formed in a sidewall shape in areas sandwiching the first gate electrode 34 in the gate longitudinal direction. When carriers are introduced into the first sidewall portions 50, carriers are accumulated mainly in the first charge accumulation films 54 of the laminated structure.

In the embodiment, the first MOSFET 30 is further provided with first impurity low concentration diffused areas 42 in the semiconductor substrate 20 below the first sidewall portions 50 and adjacent to the main surface 20a and the first impurity diffused areas 40. Accordingly, a channel forming area 43 is formed just below the first gate electrode 34 between the first impurity low concentration diffused areas 42.

In the embodiment, the first impurity low concentration diffused areas 42 have an impurity concentration lower than that of the first impurity diffused areas 40, and have a conductive type same as that of the first impurity diffused areas 40. Since the first impurity diffused areas 40 have the n-type as the conductive type, an impurity such as phosphorus is introduced into the first impurity low concentration diffused areas 42 at a low concentration.

In the embodiment, the second MOSFET 60 disposed in the second area 26 is provided with a second gate electrode 64, a pair of second impurity diffused areas 70, and a pair of second sidewall portions 80. The second gate electrode 64 is disposed on the main surface 20a of the semiconductor substrate 20 with a gate insulation film 62 therebetween. The second gate electrode 64 is formed of a laminated structure so-called a polycide structure, in which a poly-silicon film 66 and a tungsten silicide film 68 as a metal silicide film are sequentially laminated. A nitride film mask 74 is formed on the second gate electrode 64.

In the embodiment, the second impurity diffused areas 70 are formed in the semiconductor substrate 20 adjacent to the main surface 20a thereof. When the main surface 20a of the semiconductor substrate 20 is viewed from above in a plan view, the second impurity diffused areas 70 sandwich the second gate electrode 64 in a longitudinal direction thereof (gate longitudinal direction) and away from the second gate electrode 64. Further, the second impurity diffused areas 70 are areas where an n-type impurity such as arsenic (As) is diffused at a high concentration. The second impurity diffused areas 70 function as main electrode areas, i.e., a drain and a source, when the second MOSFET 60 is in operation.

In the embodiment, the second sidewall portions 80 are formed on the main surface 20a of the semiconductor substrate 20 adjacent to, i.e., directly contacting with, the second gate electrode 64. More specifically, the second sidewall portions 80 are formed on the main surface 20a of the semiconductor substrate 20 contacting with side surfaces of the gate insulation film 62, the second gate electrode 64, and the nitride film mask 74, so that the second sidewall portions 80 have a height same as that of the nitride film mask 74.

When the main surface 20a of the semiconductor substrate 20 is viewed from above in a plan view, the second sidewall portions 80 are arranged adjacent to the second impurity diffused areas 70. Further, each of the second sidewall portions 80 is formed of a laminated structure capable of accumulating charges (ONO structure), in which a second lower insulation film 82, a second charge accumulation film 84, a second upper insulation film 86, and a second sidewall nitride film 88 are sequentially laminated.

In the embodiment, the second lower insulation films 82 are formed on the main surface 20a of the semiconductor substrate 20 in an L-shape contacting with side surfaces of the gate insulation film 62, the second gate electrode 64, and the nitride film mask 74. Similarly, the second charge accumulation films 84 are arranged on the second lower insulation films 82 in an L-shape. Similarly, the second upper insulation films 86 are arranged on the second charge accumulation films 84 in an L-shape. Further, the second sidewall nitride films 88 are filled in recess portions of the second upper insulation films 86 in an L-shape such that upper surfaces thereof are flush with a top surface of the nitride film mask 74. As described above, the second sidewall portions 80 are formed in a sidewall shape in areas sandwiching the second gate electrode 64 in the gate longitudinal direction.

In the embodiment, the top surface of the nitride film mask 44 is flush with the upper surfaces of the first sidewall nitride films 58, and the top surface of the nitride film mask 74 is flush with the upper surfaces of the second sidewall nitride films 88. The configuration is not limited thereto. For example, when a contact hole is formed in a self-compatible manner, the first sidewall nitride films 58 and the second sidewall nitride films 88 are etched, so that the upper surfaces thereof may be lower than the top surfaces of the nitride film mask 44 and the nitride film mask 74.

A material and a configuration of the first charge accumulation films 54 or the second charge accumulation films 84 are arbitrary, and may be selected according to an application of the semiconductor device. For example, as the first charge accumulation films 54 and the second charge accumulation films 84, one or more insulation films formed of a silicon nitride film, an aluminum oxide film, or a hafnium oxide film may be disposed between the first lower insulation films 52 and the second lower insulation films 82, and the first upper insulation films 56 and the second upper insulation films 86, respectively.

In the embodiment, the second MOSFET 60 is further provided with second impurity low concentration diffused areas 72 in the semiconductor substrate 20 below the second sidewall portions 80 and adjacent to the main surface 20a and the second impurity diffused areas 70. Accordingly, a channel forming area 73 is formed just below the second gate electrode 64 between the second impurity low concentration diffused areas 72.

In the embodiment, the second impurity low concentration diffused areas 72 have an impurity concentration lower than that of the second impurity diffused areas 70, and have a conductive type same as that of the second impurity diffused areas 70. Since the second impurity diffused areas 70 have the n-type as the conductive type, an impurity such as phosphorus is introduced into the second impurity low concentration diffused areas 72 at a low concentration.

In the first MOSFET 30 and the second MOSFET 60, the first sidewall portions 50 and the second sidewall portions 80 have different configurations as explained below, and other components have same configurations.

In the embodiment, the first lower insulation films 52 are insulation films containing at least one of a silicon thermal oxide film and a non-doped silicate glass (NSG). That is, the first lower insulation films 52 are formed of silicon oxide films produced through, for example, a thermal oxidation method. Further, the first lower insulation films 52 cover the main surface 20a of the semiconductor substrate 20 to the side surfaces of the gate insulation film 32 and the first gate electrode 34, and have a uniform thickness of 5 to 10 nm and an L-shape.

On the other hand, the second lower insulation films 82 are insulation films containing at least a non-doped silicate glass (NSG), and are formed of a laminated structure of a first layer 92 and a second layer 94. Further, the second lower insulation films 82 cover the main surface 20a of the semiconductor substrate 20 to the side surfaces of the gate insulation film 62 and the second gate electrode 64, and have a uniform thickness of 10 to 40 nm and an L-shape.

In the embodiment, the first layer 92 is formed of a non-doped silicate glass (NSG) through, for example, a CVD method, and has a uniform thickness of 5 to 30 nm in an L-shape. Further, the second layer 94 is formed of a silicon thermal oxide film through, for example, thermal oxidation, and has a uniform thickness of 5 to 10 nm in an L-shape.

In the embodiment, the first lower insulation films 52 and the second layers 94 of the second lower insulation films 82 are formed in a same step. Accordingly, the second lower insulation films 82 has a thickness t2 larger than a thickness t1 of the first lower insulation films 52 by a thickness of the first layers 92 of the second lower insulation films 82. When the second lower insulation films 82 have the thickness t2 larger than the thickness t1 of the first lower insulation films 52, it is possible to increase a distance between an area where hot carriers are generated and the second charge accumulation films 84, as opposed to the first MOSFET 30. Accordingly, in the second MOSFET 60, it is possible to reduce a charge efficiency of hot carriers into the second charge accumulation films 84.

In the embodiment, it is preferred that the first sidewall portions 50 have a width w1 between 20 nm and 50 nm. In the memory cell portion, when the first sidewall portions 50 have the width w1 smaller than 20 nm, a leak current increases. When the first sidewall portions 50 have the width w1 greater than 50 nm, it is difficult to differentiate between a written bit and a non-written bit in the memory cell portion.

In the embodiment, it is preferred that the second sidewall portions 80 have a width w2 greater than the width w1 of the first sidewall portions 50. Accordingly, it is possible to reduce an electrical field near the second impurity diffused areas 70 functioning as the drain, and prevent hot carriers from generating. When the second sidewall portions 80 have the width w2 greater than 80 nm, a drive current of the second MOSFET 60 decreases. Accordingly, it is preferred that the second sidewall portions 80 have the width w2 smaller than 80 nm. In the specification, a width of the sidewall portion is defined as a length (thickness) of the sidewall portion along the gate longitudinal direction thereof.

In the embodiment, the first charge accumulation films 54, the first upper insulation films 56, and the first sidewall nitride films 58 of the first sidewall portions 50 have thicknesses of 5 to 10 nm, 5 to 10 nm, and 5 to 20 nm, respectively. Similarly, the second charge accumulation films 84, the second upper insulation films 86, and the second sidewall nitride films 88 of the second sidewall portions 80 have thicknesses of 5 to 10 nm, 5 to 10 nm, and 5 to 20 nm, respectively.

When the first charge accumulation films 54, the first upper insulation films 56, and the first sidewall nitride films 58 of the first sidewall portions 50, and the second charge accumulation films 84, the second upper insulation films 86, and the second sidewall nitride films 88 of the second sidewall portions 80 are formed in a same step, the width w1 of the first sidewall portions 50 is determined by the thicknesses of the first lower insulation films 52, the first charge accumulation films 54, the first upper insulation films 56, and the first sidewall nitride films 58. Further, the width w2 of the second sidewall portions 80 is determined by the thicknesses of the second lower insulation films 82, the second charge accumulation films 84, the second upper insulation films 86, and the second sidewall nitride films 88.

As a result, the first sidewall portions 50 have the width w1 of 20 to 50 nm, and the second sidewall portions 80 have the thickness w2 of 25 to 80 nm. Note that the thickness w2 of the second sidewall portions 80 is greater than the thickness w1 of the first sidewall portions 50 by the thickness of the first layers 92 of the second lower insulation films 82. Accordingly, in the first MOSFET 30, it is possible to reduce an electrical field near the second impurity diffused areas 70 functioning as the drain, and reduce an amount of hot carriers generated near the drain.

As described above, according to the embodiment of the present invention, in the second MOSFET 60, as opposed to the first MOSFET 30, it is possible to reduce an amount of hot carriers and a charge efficiency of hot carriers, thereby reducing an amount of hot carriers charged into the second charge accumulation films 84. Accordingly, in the second area 26, it is possible to prevent deterioration of the semiconductor device due to hot carriers accumulated in the second charge accumulation films 84.

Figure 2:
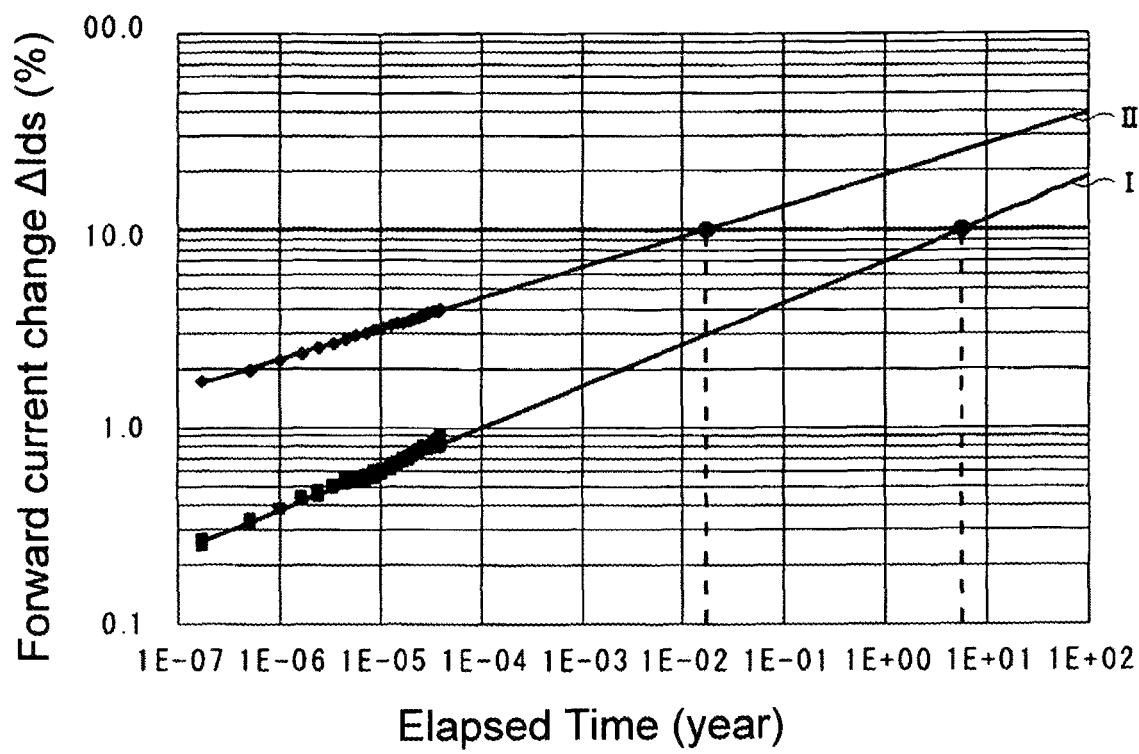
FIG. 2 is a graph showing a life of a transistor according to the embodiment of the present invention.

An experiment was conducted to measure a life of the transistor. FIG. 2 is a graph showing the life of the transistor according to the embodiment of the present invention. In FIG. 2, the horizontal axis represents an elapsed time (year) and the vertical axis represents a forward current change $\Delta$Ids (%). Further, in FIG. 2, a straight line I represents a result of the transistor according to the embodiment of the present invention. A straight line II represents a result of a conventional transistor as a comparative example. In the conventional transistor, the second insulation film was not provided with the first layer, and had a thickness same as that of the first insulation film.

In the experiment, the gate length was 0.18 μm. In the transistor according to the embodiment of the present invention, the lower insulation film had a thickness of 20 nm, and the sidewall portions had a width of 50 nm. In the conventional transistor, the lower insulation film had a thickness of 10 nm, and the sidewall portions had a width of 40 nm. As a stress condition, a voltage between the drain and the source was 3.6 V, and a voltage was applied to the gate electrode such that a forward current became a maximum value.

As shown in FIG. 2, both in the transistor according to the embodiment of the present invention (I) and the conventional transistor (I1), the forward current change $\Delta$Ids increases with time. When the life of the transistor is defined as an elapsed time at the forward current change $\Delta$Ids of 10%, the transistor according to the embodiment of the present invention (I) shows the life of 5.3 years as opposed to 0.04 year of the conventional transistor (II).

In the transistor according to the embodiment of the present invention (I), the first lower insulation films 52 were formed of the silicon thermal oxide film having a uniform thickness of 5 to 10 nm. Further, the second lower insulation films 82 were formed of the laminated film of the first layer 92 made of NSG having a uniform thickness of 5 to 30 nm and the second layer 94 made of the silicon thermal oxide film having a uniform thickness of 5 to 10 nm. The present invention is not limited to the embodiment.

For example, the first lower insulation films 52 may be formed of NSG having a uniform thickness of 5 to 10 nm. Further, the second lower insulation films 82 were formed of NSG having a uniform thickness of 10 to 40 nm. In this case, the second lower insulation films 82 are formed of a first layer 92 made of a first NSG having a uniform thickness of 5 to 30 nm and a second layer 94 made of a second NSG having a uniform thickness of 5 to 10 nm.

Further, the first lower insulation films 52 and the second lower insulation films 82 may be formed of a laminated film of NSG and the silicon thermal oxide film. In this case, the first lower insulation films 52 may be formed of a laminated film of NSG having a uniform thickness of 5 nm and the silicon thermal oxide film having a uniform thickness of 5 nm. Further, the second lower insulation films 82 may be formed of the first layer 92 made of NSG having a uniform thickness of 35 nm and the second layer 94 made of the thermal silicon oxide film having a uniform thickness of 5 nm.

With reference to FIGS. 3(A) to 3(C) to 5(A) and 5(B), a method of producing the semiconductor non-volatile memory according to the embodiment of the present invention will be explained next.

Figure 3A:
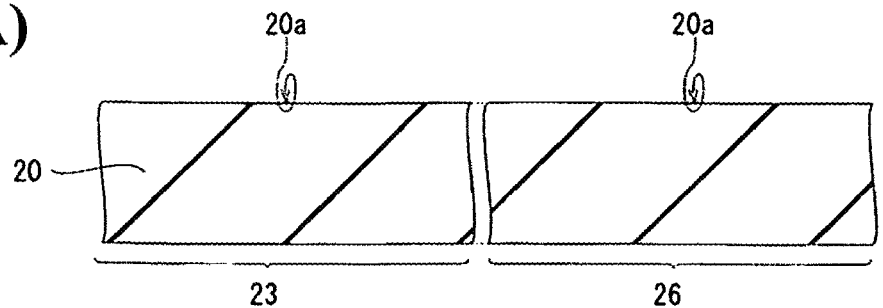
FIGS. 3(A) to 3(C) are schematic views No. 1 showing a process of producing the semiconductor non-volatile memory according to the embodiment of the present invention.
Figure 3B:
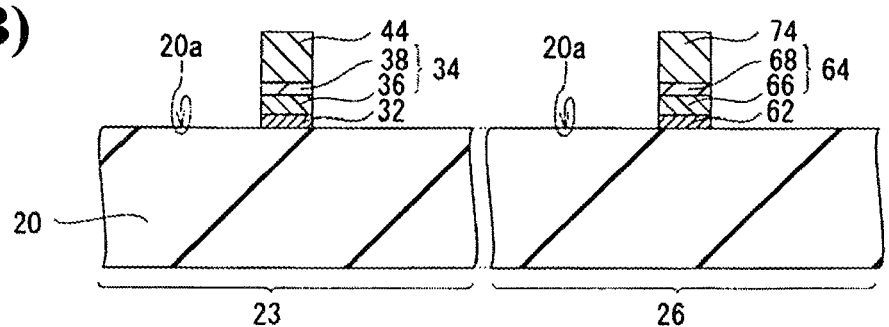
Figure 3C:
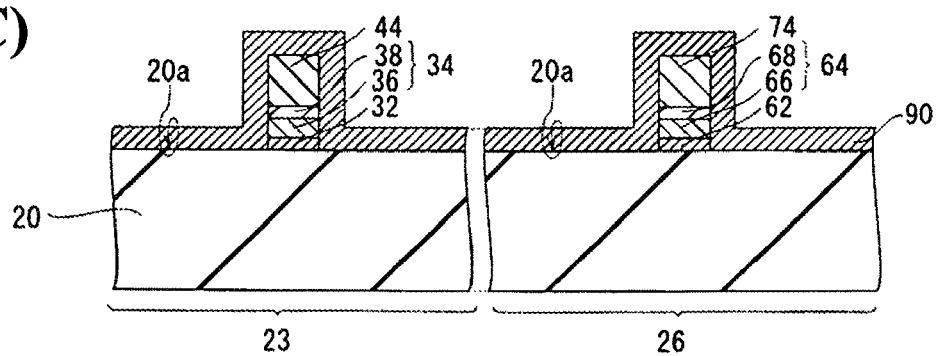
Figure 4A:
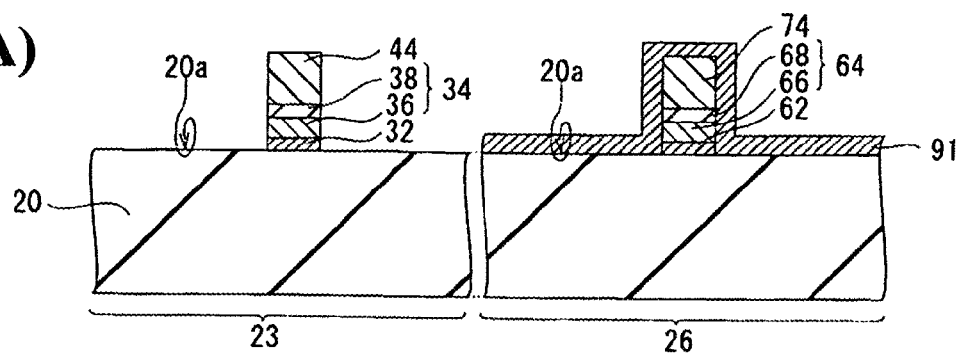
FIGS. 4(A) to 4(C) are schematic views No. 2 showing the process of producing the semiconductor non-volatile memory according to the embodiment of the present invention.
Figure 4B:
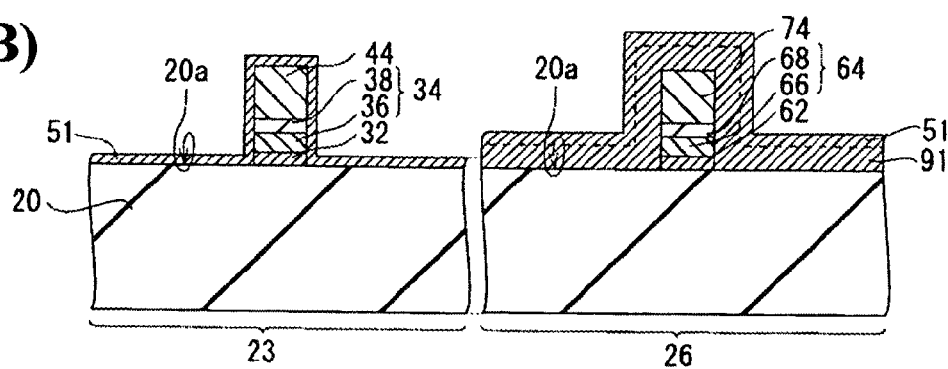
Figure 4C:
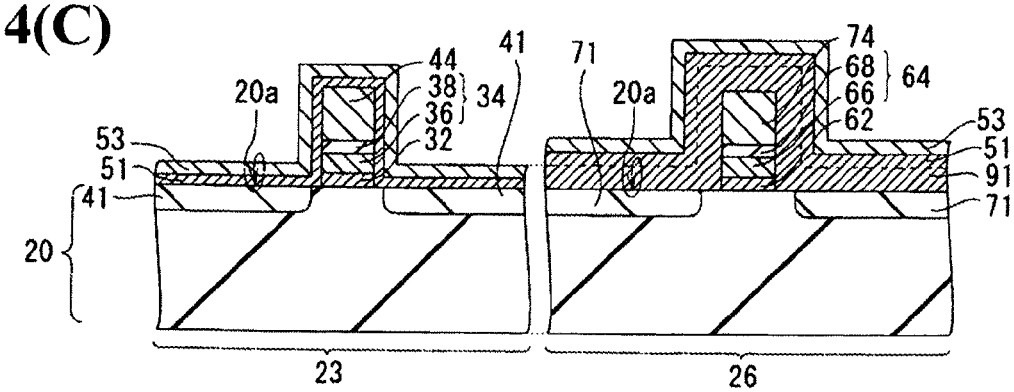
Figure 5A:
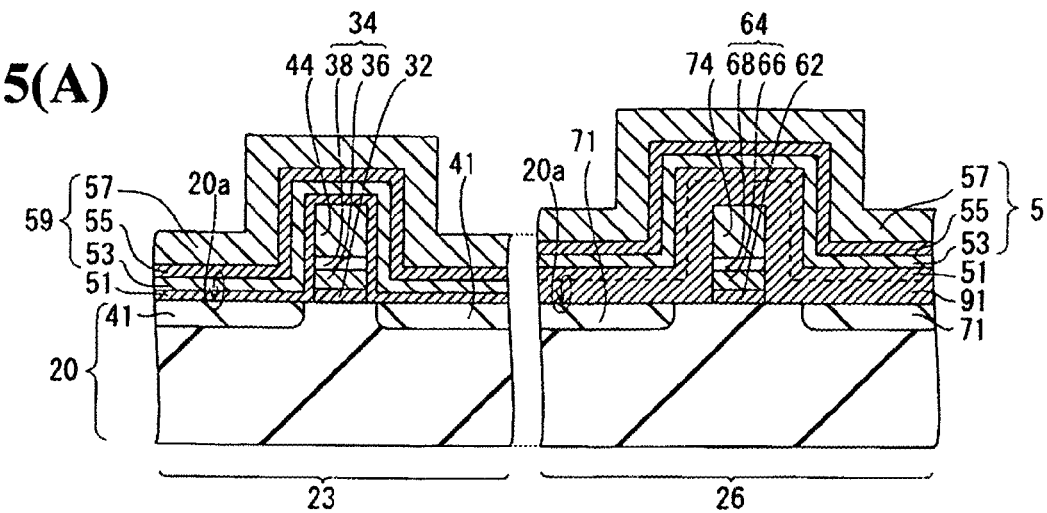
FIGS. 5(A) and 5(B) are schematic views No. 3 showing the process of producing the semiconductor non-volatile memory according to the embodiment of the present invention.
Figure 5B:
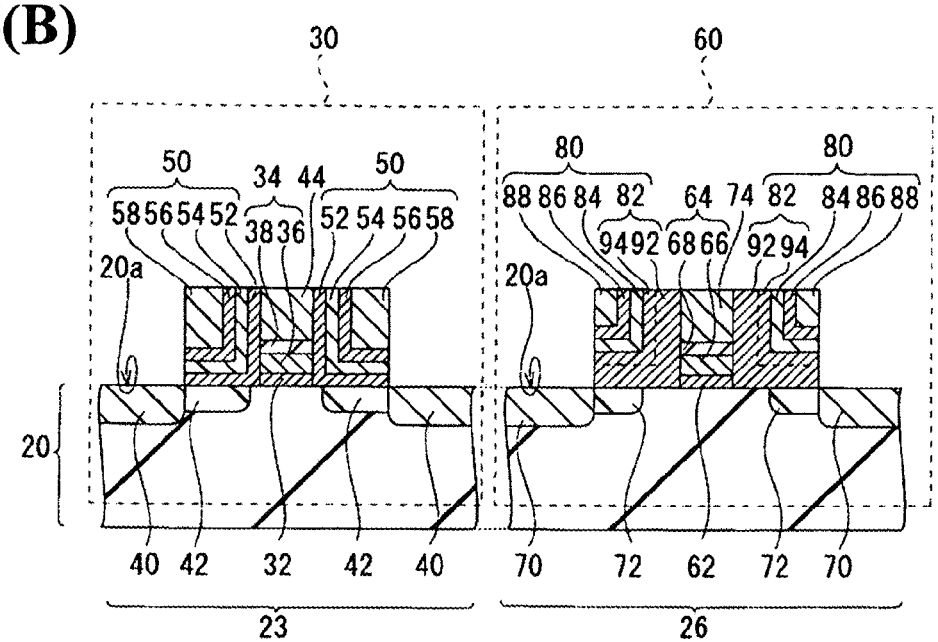
Figure 6:
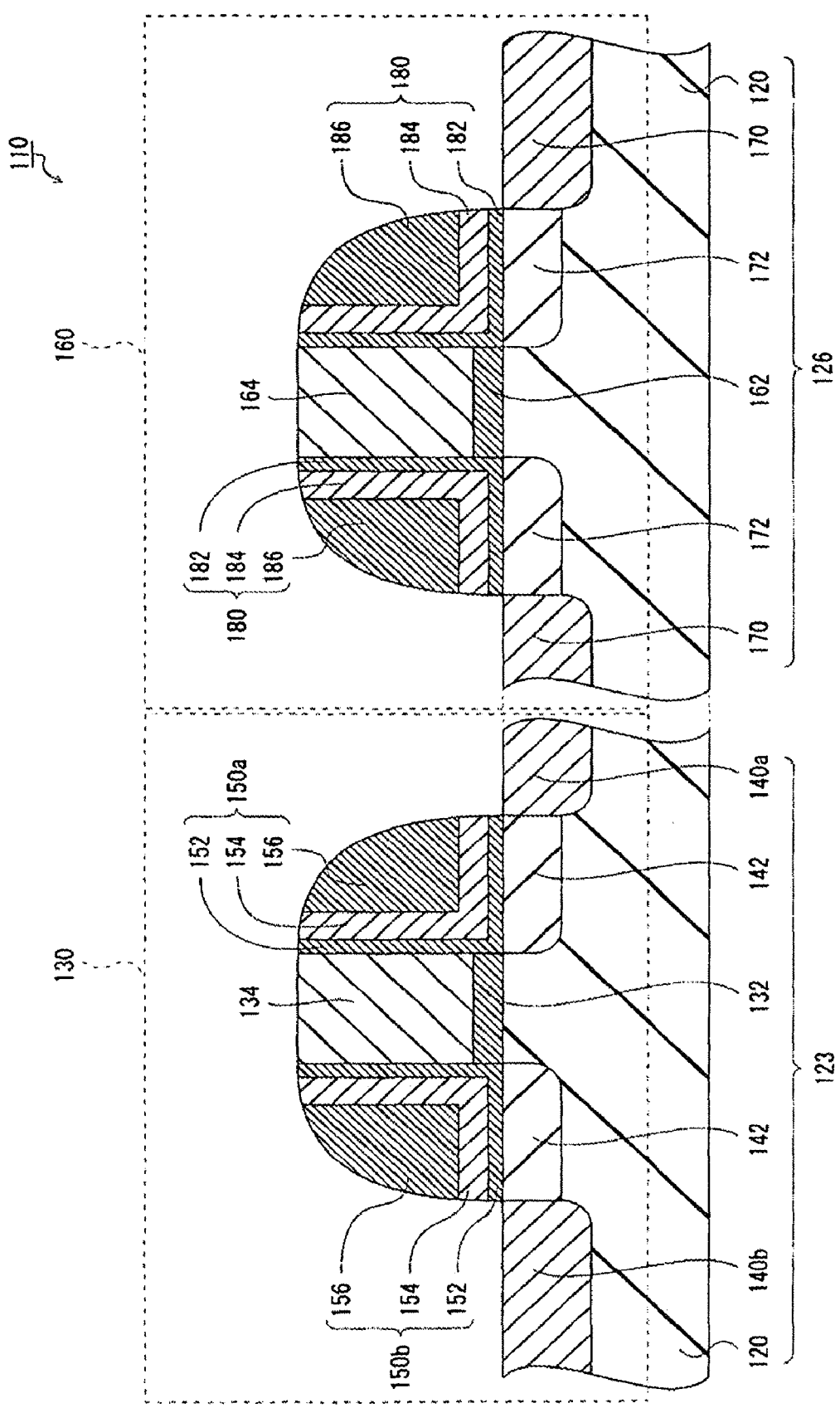
FIG. 6 is a schematic sectional view showing a conventional semiconductor non-volatile memory.

FIGS. 3(A) to 3(C) are schematic views No. 1 showing the process of producing the semiconductor non-volatile memory according to the embodiment of the present invention. FIGS. 4(A) to 4(C) are schematic views No. 2 showing the process of producing the semiconductor non-volatile memory according to the embodiment of the present invention. FIGS. 5(A) and 5(B) are schematic views No. 3 showing the process of producing the semiconductor non-volatile memory according to the embodiment of the present invention.

First, a p-type silicon substrate with the first conductive type is prepared as the semiconductor substrate 20. As shown in FIG. 3(A), the first area 23 and the second area 26 are defined on the semiconductor substrate 20. In the embodiment, the first area 23 functions as the memory cell portion for storing information, and the second area 26 functions as the peripheral circuit portion for writing and reading information relative to the memory cell portion.

In the next step, the insulation film, the conductive film, and the silicon nitride film are sequentially laminated on the main surface 20a of the semiconductor substrate 20 in the first area 23 and the second area 26. Afterward, the conductive film is patterned to form the first gate electrode 34 in the first area 23 and the second gate electrode 64 in the second area 26.

In this step, the insulation film may be formed of the silicon oxide film formed through thermal oxidation. The conductive film may be formed of a laminated structure, in which the poly-silicon film formed through a CVD method and the tungsten silicide film as the metal silicide film formed through a CVD method or a sputtering method are sequentially laminated. An impurity is doped at the same time or after the poly-silicon film is deposited, thereby providing electrical conductivity. Then, the nitride film is formed on the conductive film through a CVD method.

In the next step, a resist mask is formed on the silicon nitride film, and the silicon nitride film is patterned with the resist mask as a mask to form the nitride film mask 44 and the nitride film mask 74. In the embodiment, the nitride film mask 44 and the nitride film mask 74 are formed through a well-known method such as photolithography and dry etching. Then, the conductive film is patterned with the nitride film mask 44 and the nitride film mask 74 as an etching mask through dry etching to form the first gate electrode 34 and the second gate electrode 64. Further, the silicon oxide film is etched with the first gate electrode 34 and the second gate electrode 64 as a mask until the main surface 20a of the semiconductor substrate 20 is exposed to form the gate insulation film 32 and the gate insulation film 62.

In the next step, the resist mask formed on the nitride film mask 44 and the nitride film mask 74 is removed through ashing with photolithography, and wet cleaning is performed. The ashing and the wet cleaning may be conducted through a well-known method. As a result, as shown in FIG. 3(B), the first gate electrode 34 is formed in the first area 23, and the second gate electrode 64 is formed in the second area 26.

In the next step, NSG is deposited on the semiconductor substrate 20 for covering the first gate electrode 34 and the second gate electrode 64 through a well-known method such as reduced pressure CVD to form a NSG layer 90. In this step, the semiconductor substrate 20 is heated to about 650° C. More specifically, as shown in FIG. 3(C), the NSG layer 90 is formed on an exposed portion of the main surface 20a of the semiconductor substrate 20, side surfaces of the gate insulation film 32 and the gate insulation film 62, side surfaces of the first gate electrode 34 and the second gate electrode 64, and upper surfaces and side surfaces of the nitride film mask 44 and the nitride film mask 74. At this time, the NSG layer 90 has a uniform thickness of 5 to 30 nm.

In the next step, a resist mask (not shown) is formed through a well-known method such as photolithography to cover the second area 26 from a side of the main surface 20a. Then, a portion of the NSG layer 90 in the first area 23 exposed from the resist mask is removed, so that a NSG layer 91 in the second area 26 remains. More specifically, the portion of the NSG layer 90 in the first area 23 is removed through wet etching using diluted hydrofluoric acid as an etchant until a portion of the main surface 20a of the semiconductor substrate 20 in the first area 23 is exposed. Then, the resist mask is removed through asking, and wet cleaning is performed (FIG. 4(A)). When the NSG layer 90 in the first area 23 is removed, it is preferred that the NSG layer 90 is completely removed, or may remain by about 5 nm.

In the next step, a silicon thermal oxide film 51 is formed through thermal oxidation at about 1,000° C., so that the silicon thermal oxide film 51 has a thickness of, for example, 5 to 10 nm. More specifically, the silicon thermal oxide film 51 is formed on the semiconductor substrate 20 in the first area 23 to cover the first gate electrode 34 and on the NSG layer 91 in the second area 26.

That is, as shown in FIG. 4(B), the silicon thermal oxide film 51 is formed on the exposed portion of the main surface 20a of the semiconductor substrate 20, the side surfaces of the gate insulation film 32 and the first gate electrode 34, and the upper surface and the side surfaces of the nitride film mask 44. Then, a charge accumulation film 53 is formed on the silicon thermal oxide film 51 through a CVD method. In the embodiment, the charge accumulation film 53 is formed of the silicon nitride film, and has a thickness of about 5 to 10 nm.

In the next step, LDD impurity diffused areas 41 and LDD impurity diffused areas 71 are formed in the semiconductor substrate 20 in the first area 23 and the second area 26, respectively. More specifically, n-type ions such as phosphorus are introduced at a low concentration of $1\times10^{13}/cm^2$, and then a thermal process is performed to form the LDD impurity diffused areas 41 and the LDD impurity diffused areas 71. When the n-type ions are introduced, the NSG layer 91 formed on the first gate electrode 34, the second gate electrode 64, and the side surfaces of the second gate electrode 64, and the silicon thermal oxide film 51 and the charge accumulation film 53 formed on the first gate electrode 34 and the side surfaces of the NSG layer 91 function as a mask.

With the introduction of the ions, the low concentration areas are formed in the semiconductor substrate 20 from the main surface 20a thereof to an appropriate depth according to a design. Through the following thermal process, the portions below the first gate electrode 34 and the second gate electrode 64 except the channel areas become the LDD impurity diffused areas 41 and the LDD impurity diffused areas 71 as shown in FIG. 4(C).

In the next step, an upper portion insulation film 55 is formed on the charge accumulation film 53. In the embodiment, the upper portion insulation film 55 is formed of a silicon thermal oxide film through thermal oxidation, and has a thickness of 5 to 10 nm. Alternatively, the upper portion insulation film 55 may be formed of NSG through a CVD method, instead of the silicon thermal oxide film.

In the next step, a sidewall nitride film 57 is formed on the upper portion insulation film 55. The sidewall nitride film 57 is formed of a silicon nitride film, and has a thickness of 5 to 20 nm. As shown in FIG. 5(A), a sidewall laminate film 59 is formed of the charge accumulation film 53, the upper portion insulation film 55, and the sidewall nitride film 57, and has a thickness of 15 to 40 nm.

In the next step, an etching is performed in a direction perpendicular to the main surface 20a of the semiconductor substrate 20 until the nitride film mask 44 and the nitride film mask 74 are exposed. More specifically, the upper portion insulation film 55, the sidewall nitride film 57, the charge accumulation film 53, the silicon thermal oxide film 51 in the first area 23 and the second area 26, and the NSG layer 91 are etched to form the first sidewall portions 50 on the sidewalls of the first gate electrode 34 and the second sidewall portions 80 on the sidewalls of the second gate electrode 64, respectively.

Accordingly, the first sidewall portions 50 are formed of the first sidewall nitride films 58, the first upper insulation films 56, the first charge accumulation films 54, and the first lower insulation films 52. Further, the second sidewall portions 80 are formed of the second sidewall nitride films 88, the second upper insulation films 86, the second charge accumulation films 84, and the second lower insulation films 82.

With the etching, an upper surface, i.e., exposed surfaces of the nitride film mask 44 and the first sidewall portions 50, becomes flat, and an upper surface, i.e., exposed surfaces of the nitride film mask 74 and the second sidewall portions 80, becomes flat, respectively. Further, surfaces of the LDD impurity diffused areas 41 and the LDD impurity diffused areas 71 formed in the semiconductor substrate 20 outside the first sidewall portions 50 and the second sidewall portions 80 are exposed.

In the next step, the first impurity diffused areas 40 are formed in the first area 23, and the second impurity diffused areas 70 are formed in the second area 26. More specifically, impurity ions are introduced into the semiconductor substrate 20 in the first area 23 at a high concentration with mainly the first gate electrode 34 and the first sidewall portions 50 as a mask, and a thermal process is performed to form the first impurity diffused areas 40.

Similarly, impurity ions are introduced into the semiconductor substrate 20 in the second area 26 at a high concentration with mainly the second gate electrode 64 and the first sidewall nitride films 580 as a mask, and a thermal process is performed to form the second impurity diffused areas 70. Note that the first impurity diffused areas 40 and the second impurity diffused areas 70 are formed at the same time. At this time, as shown in FIG. 5(B), the LDD impurity diffused areas 41 and the LDD impurity diffused areas 71, where the impurity ions are not introduced at the high concentration, become the first impurity low concentration diffused areas 42 and the second impurity low concentration diffused areas 72.

In the following step, an interlayer insulation film and a wiring layer are formed with a well-known method, and detailed explanation thereof is omitted.

In the embodiment, when the second lower insulation films 82 are formed to have the thickness larger than that of the first lower insulation films 52, the non-doped silicate glass is deposited first, and then the thermal oxidation is performed. Accordingly, as compared with the case that a lower insulation film is formed only through thermal oxidation, it is possible to reduce heat applied to the semiconductor substrate 20, thereby reducing an influence of thermal history on an impurity distribution below the sidewall portions.

In the embodiment, the first lower insulation films 52 are formed of the silicon thermal oxide film, and the second lower insulation films 82 are formed of the laminated film of NSG and the silicon thermal oxide film, and the present invention is not limited thereto. For example, instead of the silicon thermal oxide film, the first lower insulation films 52 and the second lower insulation films 82 may be formed of NSG deposited through a CVD method to have a thickness of 5 to 10 nm.

In this case, after the first gate electrode 34 and the second gate electrode 64 are formed, a first NSG film as the NSG layer 91 is formed on the semiconductor substrate 20 for covering the first gate electrode 34 and the second gate electrode 64. More specifically, the first NSG film is formed on the semiconductor substrate 20, the side surfaces of the gate insulation film 32 and the first lower insulation films 52, the side surfaces of the first gate electrode 34 and the second gate electrode 64, and the upper surfaces and side surfaces of the nitride film mask 44 and the nitride film mask 74. The first NSG film has a thickness of, for example, 5 to 30 nm.

In the next step, after a portion of the first NSG film in the first area 23 is removed, instead of the silicon thermal oxide film 51, a second NSG film is formed through a CVD method. The second NSG film has a thickness of, for example, 5 to 10 nm. More specifically, the second NSG film is formed on the semiconductor substrate 20 in the first area 23 to cover the first gate electrode 34, and on the first NSG film in the second area 26. That is, the second NSG film in the second area 26 is formed on the semiconductor substrate 20, the side surfaces of the gate insulation film 32, the side surfaces of the first gate electrode 34, and the upper surface and the side surfaces of the nitride film mask 44.

When the first lower insulation films 52 and the second lower insulation films 82 are formed of NSG as described above, it is not necessary to perform a thermal process to form the first lower insulation films 52 and the second lower insulation films 82. Accordingly, it is possible to further reduce an influence of thermal history on an impurity distribution below the sidewall portions.

In the embodiment described above, the first conductive type is the p-type, and the second conductive type is the n-type. Further, the first MOSFET 30 and the second MOSFET 60 are NMOS. The present invention is not limited to the embodiment. That is, the first conductive type may be the n-type, and the second conductive type may be the p-type.

Further, the first MOSFET 30 and the second MOSFET 60 may be PMOS. The configuration of the MOSFET having the LDD structure may be a well-known configuration.

The disclosure of Japanese Patent Application No. 2007-081759, filed on Mar. 27, 2007, is incorporated in the application by reference.

While the invention has been explained with reference to the specific embodiments of the invention, the explanation is illustrative and the invention is limited only by the appended claims.

What is claimed is:

1. A semiconductor device comprising:
a semiconductor substrate having a first area and a second area;
a first field effect transistor disposed in the first area, said first field effect transistor including a first gate electrode formed on the semiconductor substrate with a first gate insulation film therebetween, a pair of first impurity diffused areas formed in areas sandwiching the first gate electrode, and a pair of first sidewall portions disposed adjacent to the first gate electrode, said first sidewall portions including a first lower insulation film and a first charge accumulation film laminated sequentially, said first lower insulation film containing at least one of a silicon thermal oxide film and a non-doped silicate glass; and
a second field effect transistor disposed in the second area, said second field effect transistor including a second gate electrode formed on the semiconductor substrate with a second gate insulation film therebetween, a pair of second impurity diffused areas formed in areas sandwiching the second gate electrode, and a pair of second sidewall portions disposed adjacent to the second gate electrode, said second sidewall portions having a width along a gate longitudinal direction larger than that of the first sidewall portions, said second sidewall portions including a second lower insulation film and a second charge accumulation film laminated sequentially, said second lower insulation film containing a non-doped silicate glass, said second lower insulation film having a thickness larger than that of the first lower insulation film.

2. The semiconductor device according to claim 1, wherein said first sidewall portions have the width in a range of 20 nm to 50 nm; said second sidewall portions have the width in a range of 25 nm to 80 nm; said first lower insulation film has the thickness in a range of 5 nm to 10 nm; and said second lower insulation film has the thickness in a range of 10 nm to 40 nm.

3. The semiconductor device according to claim 1, wherein said first field effect transistor further includes a first channel forming area in the semiconductor substrate below the first gate electrode; said first field effect transistor further includes a first low concentration impurity diffused area between the first impurity diffused areas, said first low concentration impurity diffused area having an impurity concentration lower than that of the first impurity diffused areas, said first low concentration impurity diffused area having a conductive type same as that of the first impurity diffused areas; said second field effect transistor further includes a second channel forming area in the semiconductor substrate below the first gate electrode; and said second field effect transistor further includes a second low concentration impurity diffused area between the second impurity diffused areas, said second low concentration impurity diffused area having an impurity concentration lower than that of the second impurity diffused areas, said second low concentration impurity diffused area having a conductive type same as that of the second impurity diffused areas.

4. The semiconductor device according to claim 1, wherein said first lower insulation film is formed of a silicon thermal oxide film, and said first lower insulation film is formed of a laminated film of a non-doped silicate glass and a silicon thermal oxide film laminated sequentially.

5. The semiconductor device according to claim 1, wherein said first lower insulation film is formed of a non-doped silicate glass, and said first lower insulation film is formed of a non-doped silicate glass.

6. The semiconductor device according to claim 1, wherein said first lower insulation film is formed of a laminated film of a non-doped silicate glass and a silicon thermal oxide film, and second first lower insulation film is formed of a laminated film of a non-doped silicate glass and a silicon thermal oxide film.

* * * * *